(12) United States Patent
Lin

(10) Patent No.: US 8,537,022 B2
(45) Date of Patent: Sep. 17, 2013

(54) METHOD AND DEVICE FOR CONFIGURABLE GROUND MONITORING OF A WORKBENCH

(75) Inventor: Tony-Sheng Lin, Taipei (TW)

(73) Assignee: Tony-Sheng Lin, Taipei (TW)

( * ) Notice: Subject to any disclaimer, the term of this patent is extended or adjusted under 35 U.S.C. 154(b) by 350 days.

(21) Appl. No.: 13/087,573

(22) Filed: Apr. 15, 2011

(65) Prior Publication Data

US 2011/0254693 A1 Oct. 20, 2011

(30) Foreign Application Priority Data

Apr. 15, 2010 (TW) ................................ 99111871 A

(51) Int. Cl.
*G08B 21/00* (2006.01)
(52) U.S. Cl.
USPC ........... 340/649; 340/635; 340/657; 340/660; 340/663; 361/1
(58) Field of Classification Search
None
See application file for complete search history.

(56) References Cited

U.S. PATENT DOCUMENTS

| 4,649,374 | A | * | 3/1987 | Hoigaard | ................... | 340/573.1 |
| 5,422,630 | A | * | 6/1995 | Quinn et al. | ................... | 340/661 |
| 5,969,626 | A | * | 10/1999 | Maciel | ........................... | 340/649 |
| 6,414,600 | B1 | * | 7/2002 | Plukphongrat et al. | ........ | 340/649 |
| 6,930,612 | B1 | * | 8/2005 | Kraz et al. | ..................... | 340/649 |
| 7,118,380 | B1 | * | 10/2006 | Kraz et al. | ....................... | 439/37 |
| 2010/0305887 | A1 | * | 12/2010 | Lakich et al. | ................... | 702/60 |

\* cited by examiner

*Primary Examiner* — George Bugg
*Assistant Examiner* — Munear Akki
(74) *Attorney, Agent, or Firm* — WPAT, P.C.; Anthony King

(57) ABSTRACT

The invention provides a method for configurable ground monitoring of a workbench, and the method comprises the steps as follows. The step of detecting if each of monitored objects of a monitor device is enable should be performed first. A digital value of each of the monitored objects according to detecting result is then calculated and accumulated. The step of detecting if each of the monitored objects reaches a predetermined number of samples is performed, and the step of calculating an average value of each of the monitored objects according to detecting result is followed. The average measured value is compared with a predetermined digital limit-value of each of the monitored objects; furthermore, a corresponding alarm will be sounded when the average measured value exceeds the predetermined digital limit-value. The digital value and a compared result are then sent, and then the step of detecting if the operator ground connection is enabled is performed. A timer counter is then renewed according to detecting result, and an alarm will be sounded when the operator did not maintain ground connection and is exceeding a predetermined time period. A device using the abovementioned method is also disclosed in the present invention.

10 Claims, 7 Drawing Sheets

METHOD AND DEVICE FOR CONFIGURABLE GROUND MONITORING OF A WORKBENCH

CROSS-REFERENCE TO RELATED APPLICATIONS

This Non-provisional application claims priority under 35 U.S.C. §119(a) on Patent Application No(s). 099111871 filed in Taiwan, Republic of China, Apr. 15, 2010, the entire contents of which are hereby incorporated by reference.

FIELD OF THE INVENTION

This invention relates to a method and device for ground monitoring of a workbench, especially relates to a method and device for configurable ground monitoring of a workbench.

BACKGROUND OF THE INVENTION

An operator engaged in an electronic engineering career or an inflammable and explosives-related career will often contact the devices, byproducts or materials which are very sensitive to electrostatic or body voltage. Therefore, it should be careful to keep grounding between the operator and an operating environment whatever the ground connection between the operator and the operating environment is perform through an electrostatic ground connection or an alternating current ground connection.

Generally, a good workbench will be required for considering how to keep the ground connection well between the operator and a surface of the workbench. The main purpose of the abovementioned requirement is for approaching an isoelectric effect between every material, which is sensitive to the electrostatic voltage whatever it focuses on the electrostatic ground connection or a combination of the electrostatic ground connection and a power ground connection, in order to prevent the damage and hurt of the products and environments by an electrostatic discharge. The ground connection of the traditional workbench is performed by measuring the ground resistance of the workbench surface and that of the operator, and then monitors these two objects. For the stricter requirement, it also monitors the resistance of the equipment (electronic microscope, for instance) on the workbench.

The prior art is performed by pre-setting a fixed analog limit-value (ex: a voltage) of the ground resistance of the operator, the workbench and the equipment separately. And then, the real measured analog values of the traditional workbench will be compared with these analog limit-values in order to determine whether the real measured values are still in a normal range. The prior art has two disadvantages as follows:

(1) The prior art compares the value from the monitor and the value from the pre-set value without determining the real value. Not determining the real value can cause some mistakes or problems of reliabilities due to the lack of precision in the calculations of measured value.

(2) According to the prior art, the parameter settings of systems will not vary depending on the different environment, which will cause inconvenience and the limit of the application.

SUMMARY OF THE INVENTION

The present invention is used to solve the disadvantages existed in the prior art. Therefore, the present invention discloses a method and device for ground monitoring of a workbench, and the method disclosed here can configurably set several monitored objects and monitor automatically and simultaneously if the operator keeps the ground connection well. The method disclosed in the present invention can match different requests under each kind of the environment and reduce the total cost due to its strict requirement about the ground connection, the measured values calculated through a digital calculation method, its configurable monitored objects, timely comparing and timely alarm.

The present invention discloses a method for ground monitoring of a workbench, and the method is performed through a digital measuring technology, configurable setting for each of monitored objects and monitoring simultaneously if an operator keeps the ground connection well. The monitored objects of the workbench include operator ground resistance, operator ground voltage, mat ground resistance, and equipment ground resistance. At the same time, a computer having memory and processor executes a process comprising the step of monitoring whether an operator remains connected to an electrical ground. Implementation of this software routine will prevent the operator from damaging the static sensitive products due to the lack of the personnel grounding.

The method for ground monitoring of the workbench comprises the steps as follows: The first step is to instruct a computer to detect if the operator establishes the ground connection after the monitoring device is enabled to enter an initial state, if not, an alarm is sounded. A computer can determine whether operator ground resistance, ground voltage, mat ground resistance, or equipment ground resistance is enabled, and if so, the computer can store in memory a digital record of the values of these resistances or voltages. And then, the step of detecting if each of the monitored objects reaches a predetermined number of samples is performed, and the step of calculating an average value of each of the monitored objects is followed. An average measured value is compared with a predetermined digital limit-value of each of the monitoring object; furthermore, a corresponding alarm will be sounded when the average measured value exceeds the predetermined digital limit-value. The measured values are then sent. The step of detecting if the operator keeps the ground connection well is performed continuously, if not, an alarm is sounded. The abovementioned steps of detecting each monitoring object and measuring will be repeated wherein the monitoring device comprises a monitor capable of calculating a real value of each monitoring object.

The invention also provides a device for configurable ground monitoring of a workbench. The device comprises an operator ground connection detecting unit, an operator ground resistance and ground voltage detecting unit, a mat ground resistance detecting unit, an equipment ground resistance detecting unit, an application-specific processor, a ground unit and a communication connection unit. The main purpose of the device is to provide a monitoring mechanism using a digital measuring method for monitoring the operator ground resistance, the operator ground voltage, the mat ground resistance and the equipment ground resistance. It also facilitates the operator to monitor and modify these four items anytime as required. Each monitoring object can also be adjusted to different value to satisfy various requirements of different tasks or rules of the work environment.

According to the abovementioned, the present invention discloses a method and device for configurable ground monitoring of the workbench. The invention improves the requirement for the ground monitoring of the workbench, and increases the selectivity of the monitored objects and monitoring limit-value by the digital calculation method. The invention can calculate the value of the monitoring object and compare the value with a configurable limit-value to generate an alarm timely. The invention also provides a notice function for monitoring if the operator maintains the ground connection well. The invention is able to check each selected ground connection and improve the total efficacy of ground monitoring of the workbench.

Please refer to FIGS. 1~6, the features and advantages of the present invention will be understood by the following illustration.

BRIEF DESCRIPTION OF THE DRAWINGS

FIG. 2-1 shows a process diagram of the method disclosed in the present invention, and the FIG. 2-1 is the first half of the complete process diagram;

FIG. 2-2 shows a process diagram of the method disclosed in the present invention, and the FIG. 2-2 is the second half of the complete process diagram;

DETAILED DESCRIPTION OF THE INVENTION

According to the method and device disclosed in the presented invention, a preferred embodiment will be illustrated along with the figures as the following.

Figure 1:
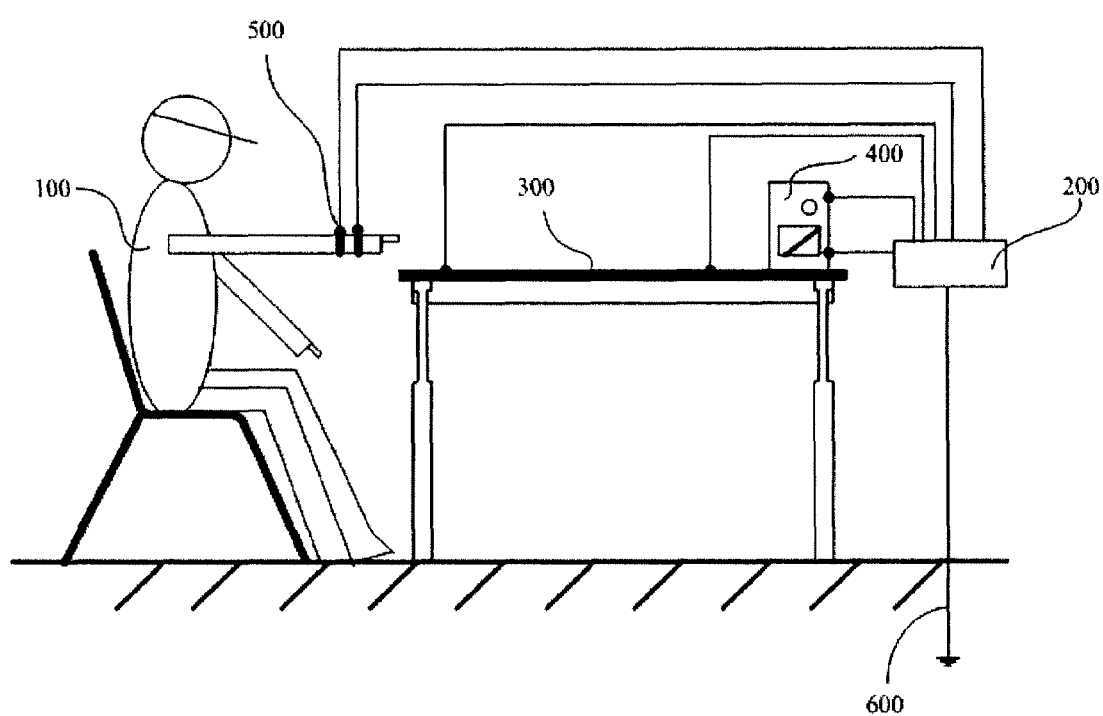
FIG. 1 shows a real operating environment disclosed in the present invention.

Please refer to FIG. 1. FIG. 1 shows a real operating environment disclosed in the present invention, and an operator 100 wears a dual wrist strap and operates on a workbench 300. An equipment 400 is placed on the workbench, and a monitor device 200 is used for monitoring the connection status between the operator 100, a mat 300, the equipment 400 and a ground unit 600 separately. The abovementioned four monitored objects can be configurable according to the user's need, and the limit-value of the monitored objects can also be set into different values for satisfying the different needs of the user or the requirement of each kind of the operating environment, for example ANSI/ESD S20.20-2007.

Figures 1, 2:
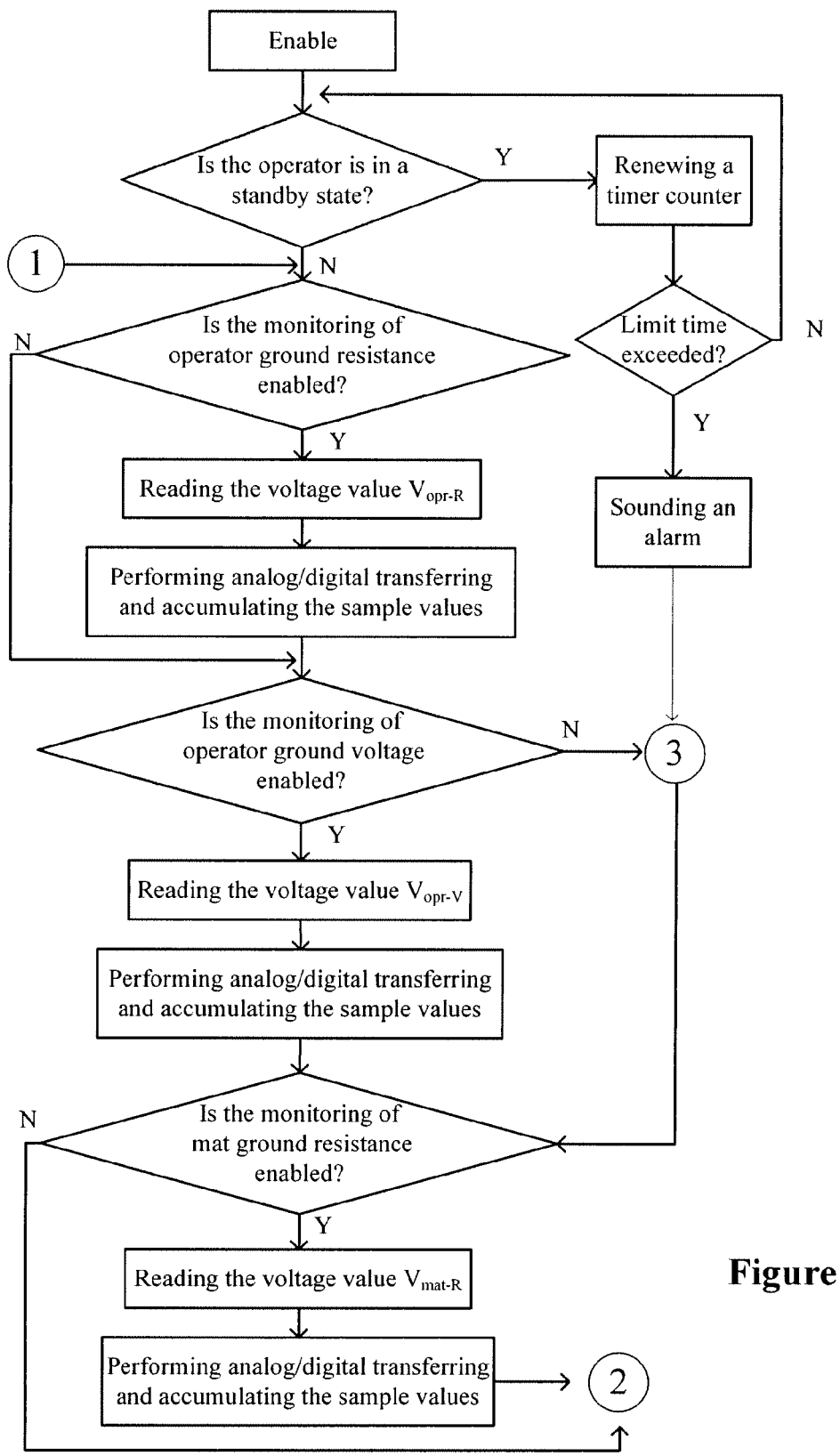
Figure 2:
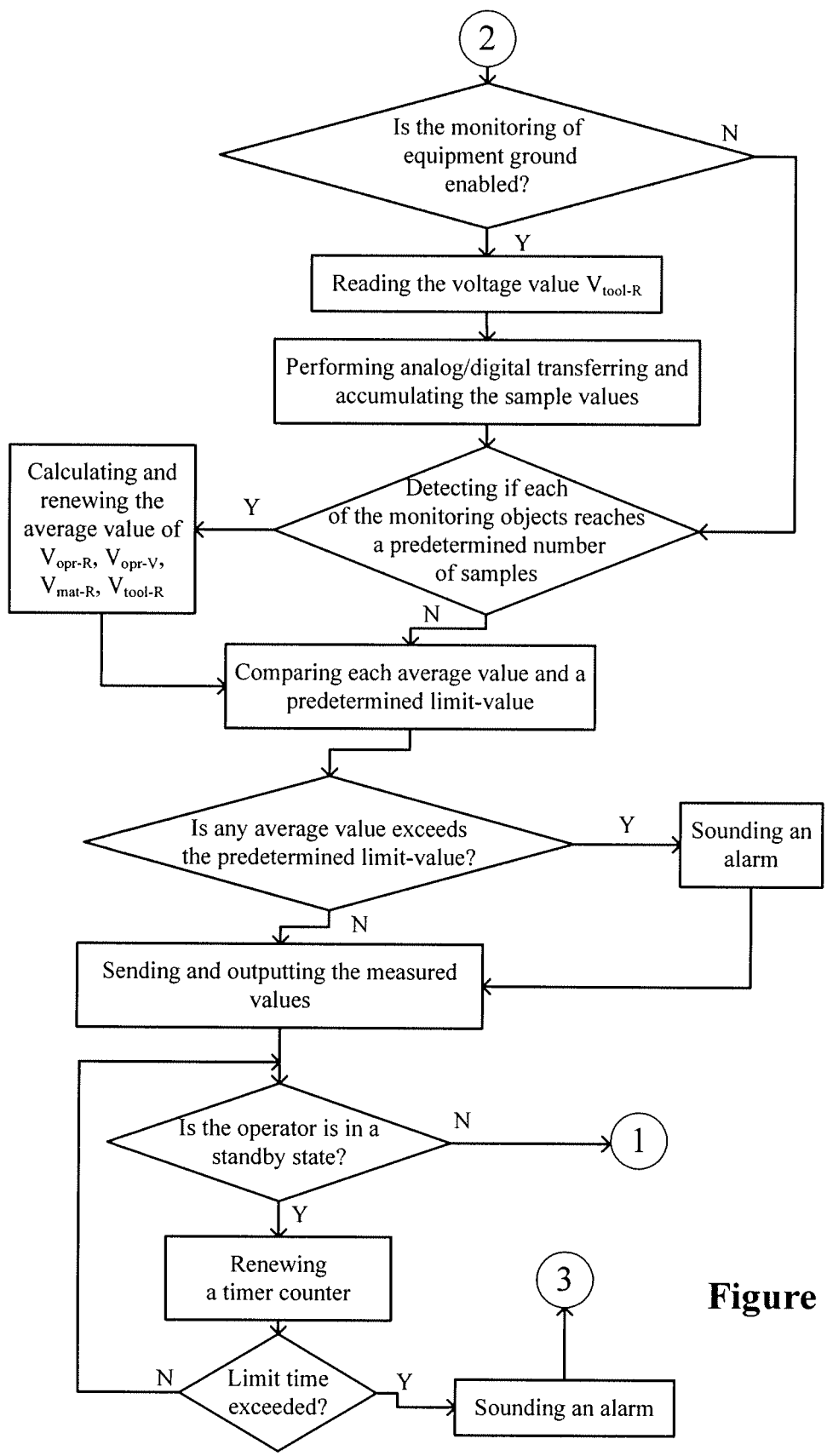

Please refer to FIG. 2-1 and FIG. 2-2. FIG. 2-1 shows a process diagram of the method disclosed in the present invention, and the FIG. 2-1 is the first half of the complete process diagram. FIG. 2-2 shows a process diagram of the method disclosed in the present invention, and the FIG. 2-2 is the second half of the complete process diagram. The method comprises the steps of:

(1) After the monitoring device is enabled to enter an initial state, detecting if the operator establishes the ground connection, if not, sounding an alarm.
(2) Detecting if the monitoring of operator ground resistance is enabled or not, if yes, calculating and accumulating its digital values.
(3) Detecting if the monitoring of operator ground voltage is enabled or not, if yes, calculating and accumulating its digital values.
(4) Detecting if the monitoring of mat ground resistance is enabled or not, if yes, calculating and accumulating its digital values.
(5) Detecting if the monitoring of equipment ground resistance is enabled or not, if yes, calculating and accumulating its digital values.
(6) Detecting if each of the monitored objects reaches a predetermined number of samples, and calculating an average value of each of the monitored objects.
(7) Comparing an average measured value with a predetermined digital limit-value of each of the monitoring object, furthermore, sounding a corresponding alarm when the average measured value exceeds the predetermined digital limit-value.
(8) Outputting the measured values.
(9) Detecting if the operator continuously maintains the ground connection well, if not, sounding an alarm.
(10) Repeating the abovementioned steps 2~9 of detecting each monitoring object and measuring.

The step of enabling/disabling each of the monitored objects can be set configurably by a user through an external communication connection of the monitor device. The digital limit-value of each monitored objects can be configurable through the same method as abovementioned. The concepts of the step 1 and the step 9 are similar. The step 1 is a detecting step performed in the beginning of the monitoring process; however, the step 9 is used for continuously monitoring the detection in process. The length of the limit time in detecting the un-grounded connection can be different. If the length of the limit time is the same, the two steps can be merged.

Figure 3:
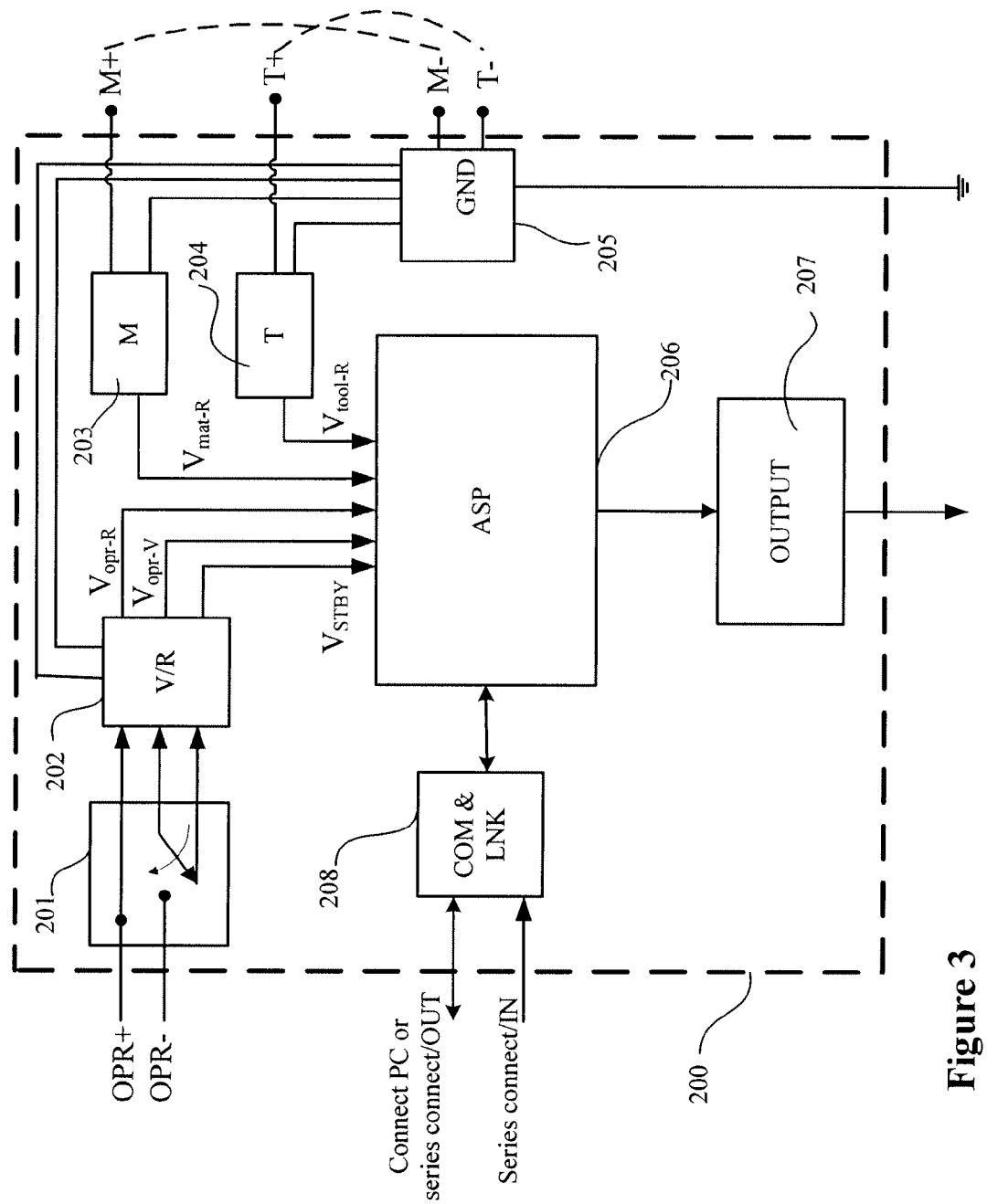
FIG. 3 shows a device for ground monitoring of a workbench disclosed in the present invention.

The method and device for configurable ground monitoring of the workbench disclosed in the present invention is mainly used for decreasing the electrostatic damages of the workbench and increasing the efficiency of the workbench protection. The main purpose of the device disclosed here is to provide a monitoring mechanism using a digital measuring method for monitoring the operator ground resistance, the operator ground voltage, the mat ground resistance and the equipment ground resistance. It also facilitates the operator to monitor and modify these four items anytime as required. Each monitoring object can also be adjusted to different value to satisfy various requirements of different tasks or rules of the work environment. At the same time, the monitoring method can also detect if the operator maintains ground connection well. It will prevent the operator from damaging the static sensitive products due to the lack of the proper personnel grounding when sitting at a workbench. The method disclosed in the present invention can be realized-by a device for configurable ground monitoring of the workbench. Please refer to FIG. 3. FIG. 3 shows a device for ground monitoring of a workbench disclosed in the present invention, and the devices comprises: an operator ground connection detecting unit 201 that is used to detect if the operator plugs a dual wrist strap into the operator ground connection detecting unit 201 for the ground connection. The operator ground connection provides a circuit for calculating an operator ground resistance and a ground voltage. The dual wrist strap is a popular device used in the personnel ground connection, and contacts the human body through two separate metal contacts of two wires. The first one contacts the skin to let current enter into the human body, and the other one also contacts the skin to let the current leave the human body to form a closed path. The operator ground connection detecting unit 201 is constructed of reeds and special wirings to determine if the operator really does the ground connection. After inserting the dual wrist strap into the operator ground connection detecting unit 201, OPR− and path (2) form a passage, and further, path (1) and path (2) form a closed loop circuit through the human body and the two contact points OPR+, OPR− of the dual wrist strap. At the same time, path (2) and path (3) form an open circuit. Therefore, path (2) and path (3) form a closed circuit when the operator doesn't insert the dual wrist strap into the operator ground connection detecting unit 201. We will identify this as "Standby" state.

An operator ground resistance and ground voltage detecting unit 202 (V/R) can generate a voltage signal of the operator ground resistance and the ground voltage, and determine if the operator is in a standby state without the ground connection. The human body of the operator and the path (1), (2) form a closed input circuit, and then form a measuring circuit with two ground wire wherein the measuring circuit is bigger than the closed input circuit and the ground wires are connected to a ground unit 205. And further, the measuring circuit is used for measuring the voltage signal $V_{opr-R}$ and $V_{opr-V}$ corresponding to the operator ground resistance and the ground voltage.

Figure 4:
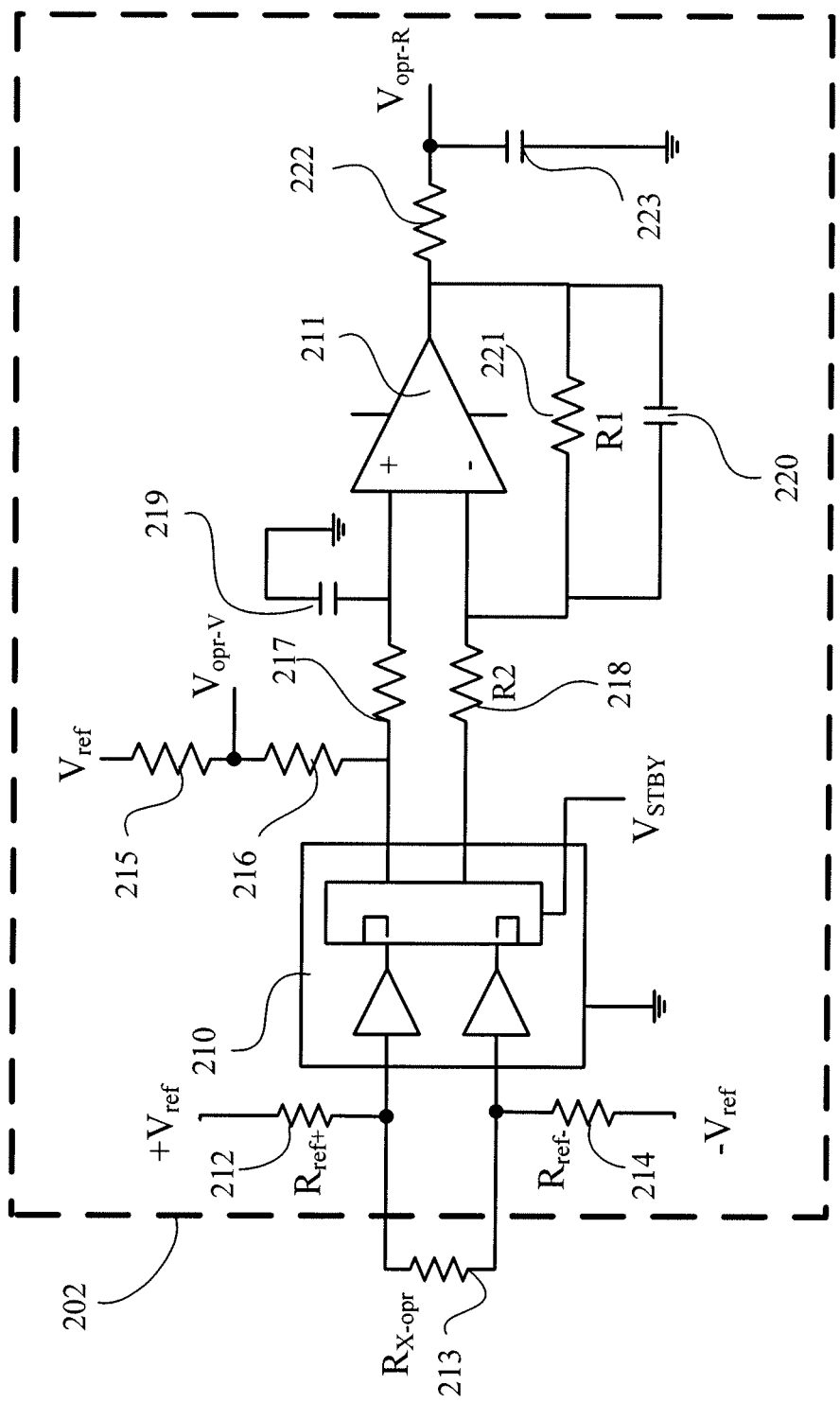
FIG. 4 shows a operational amplifier circuit for measuring the ground resistance and the ground voltage of the operator.

Please refer to FIG. 4, FIG. 4 shows an operational amplifier circuit for measuring the ground resistance and the ground voltage of the operator. The operator ground resistance and ground voltage detecting unit 202 is mainly constructed of an operational amplifier. In view of the safety of the human body, the measuring circuit use ultra low voltage. Therefore, voltage references $+V_{ref}$ and $-V_{ref}$ can be values as small as 100 mV. The resistors 212, 213, 214 construct a dividing circuit. In order to let the voltage of the human body approach to a zero voltage during the measuring of the signal on the human body, the using of the symmetrical voltage references are essential. The resistance 213 ($R_{x-opr}$) is an equivalent resistance of the human body in the measuring circuit, and the current/voltage signal thereon is very small and easy to be interfered with a noise received by the human body. Therefore, the current/voltage signal thereon should pass a noise filtering and standby detecting circuit 210. The noise filtering and standby detecting circuit 210 can be constructed of an instrumentation amplifier, and an out signal will be gotten wherein the output signal comprises a ground voltage of the human body $V_{opr-V}$ and a standby signal $V_{stby}$. The resistors 215, 216 provide a suitable bias voltage for the ground voltage of the human body $V_{opr-V}$. If the operator doesn't insert the dual wrist strap into the monitor device, the resistance 213 ($R_{x-opr}$) is an open circuit. And then, $V_{stby}$ generated herein is a voltage signal representing to a standby status, otherwise another voltage value is generated herein to represent an un-grounded status. The weak voltage signal representing the ground resistance of the human body will be amplified to an output signal $V_{opr-R}$ through the operational amplifier with a suitable magnification for further processing by an application-specific processor 206. The element 211 is the operational amplifier, and the magnification is decided by the resistor 221 (R1) and the resistor 218 (R2). The capacitors 219, 220 and 223 filter the high frequency noise of the circuit. The operational amplifier operates according to the following equation:

$$V_{opr-R}=V_{ref} \times R_{x-opr}/(R_{x-opr}+R_{ref+}+R_{ref-}) \times Gain_{op}$$

Wherein the value of $Gain_{op}$ is decided by the resistor 221 (R1) and the resistor 218 (R2).

A mat ground resistance detecting unit 203 (M) generates a mat ground resistance wherein M+ and M− form a closed circuit through the ground unit 205 and the external mat 300 for measuring a voltage signal $V_{mat-R}$ corresponding to the mat ground resistance, and then the voltage signal $V_{mat-R}$ will be further processed by the application-specific processor 206.

Figure 5:
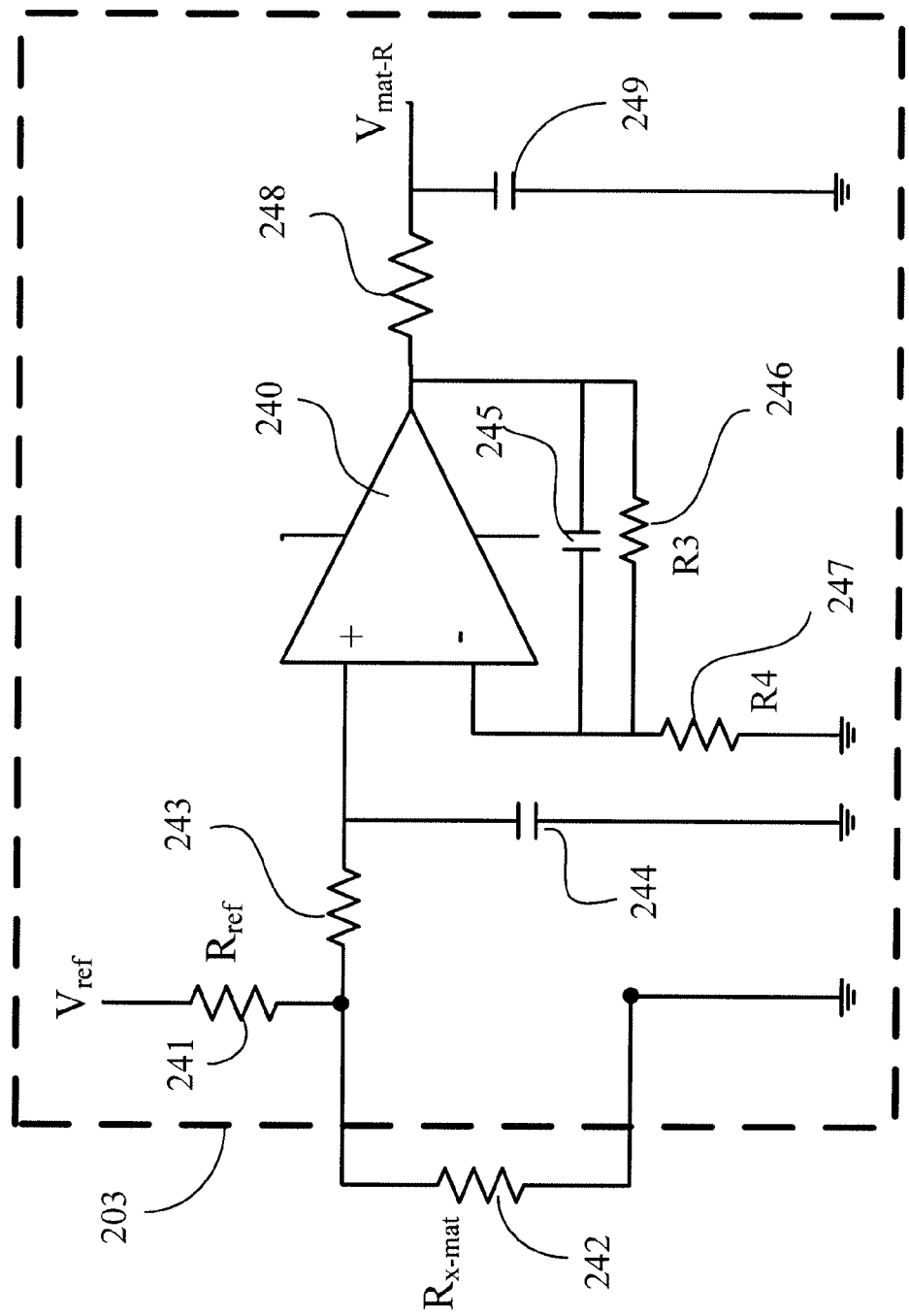
FIG. 5 shows a operational amplifier circuit for measuring the ground resistance of the mat and the equipment.

Please refer to FIG. 5, FIG. 5 shows an operational amplifier circuit for measuring the ground resistance of the mat and the equipment. The mat ground resistance detecting unit 203 is mainly constructed of an operational amplifier 211, too. The operation of the mat ground resistance detecting unit 203 is similar to the operator ground resistance amplifier. The mat resistance 242 ($R_{x-mat}$), which is waiting to be measured, shares a voltage from the voltage reference $V_{ref}$ and the voltage signal is then amplified by the amplifier with the magnification factor decided by the resistor 246 (R3) and the resistor 247 (R4) to get a measuring signal between 0V and $V_{ref}$. The element 240 is the operational amplifier, and further, the capacitors 244, 245 and 249 filter the high frequency noise of the circuit. The resistors 243, 248 provide a suitable current for the circuit.

An equipment ground resistance detecting unit 204 (T) can generate an equipment ground resistance signal of the equipment wherein T+ and T− form a closed circuit through the ground unit 205 and the external equipment for measuring a voltage signal $V_{tool-R}$ corresponding to the equipment ground resistance, and then the voltage signal $V_{tool-R}$ will be further processed by the application-specific processor 206.

The circuit design and the operation of the equipment ground resistance detecting unit 204 is similar to the mat ground resistance detecting unit 203, however, there is a little difference on the bias voltage and dividing voltage of the amplifier due to the difference of the measuring range. The measuring range of the mat ground resistance may be from several MΩ to a few hundred MΩ, whereas the measuring range of the equipment ground resistance may be from a few Ω to a few dozen Ω.

The ground unit 205 (GND) is an essential element for constructing a closed circuit of the operator ground resistance circuit, the mat ground resistance circuit and the equipment ground resistance circuit separately.

Figure 6:
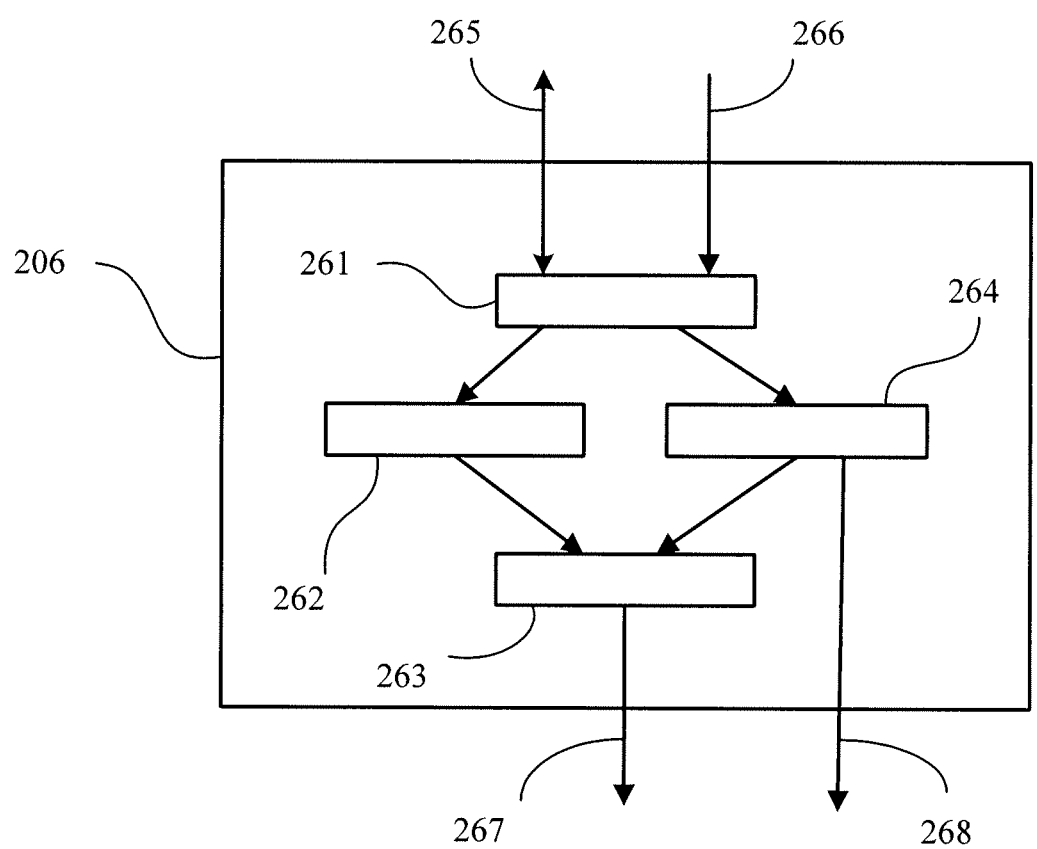
FIG. 6 shows the relationship between the main elements of the application-specific processor and each component used in the present invention.

Please refer to FIG. 6, FIG. 6 shows the relationship between the main elements of the application-specific processor 206 and each component used in the present invention. The application-specific processor 206 reads the measured voltage signals provided by the operator ground resistance and ground voltage detecting unit 202, the mat ground resistance detecting unit 203 and the equipment ground resistance detecting unit 204, and reads the control signals provided by a communication connection unit 208 to determine the overall monitoring status. First, each of the measuring voltage data 266 is inputted and saved in I/O register 261, and transferred into the digital data through an analog to digital converter 264. After summarizing and averaging, the digital data will be compared with the digital limit-value, which is predetermined by the user, through a comparator 263 to decide if an alarm should be sounded or not. And then, the result of the abovementioned steps will be outputted to an output unit 207 by control output 267 or data output 268. The application-specific processor 206 communicates bilaterally with the communication connection unit 208 to deal with commands sent from PC or external controlling device, and deal with serial protocol that is used to cascade several monitor devices.

The application-specific processor 206 further comprises an enable/disable management module of the limit-value and the monitored objects 262, and the enable/disable management module 262 can accept the configurable set adjusted by the user through serial command control input 265. The configurable set adjusted by the user is used to decide if the monitored objects are enabled or not; furthermore, to decide the different limit-values. Moreover, the application-specific processor 206 further comprises a calculation method for filtering 50 Hz/60 Hz noise attached on a human body by selecting a suitable digital sampling time.

The application-specific processor 206 can determine if the operator is in the standby state without the ground connection according to the output generated by the operator ground detecting unit 201 and the operator ground resistance and ground voltage detecting unit 202. A timer counter is used to meter the time period when the operator is in the standby state without the ground connection. An alarm is sounded when the operator doesn't insert the dual wrist strap into the operator ground connection detecting unit within a predetermined time period, 1 minute for example.

The output unit 207 receives data sent from the application-specific processor 206 and displays a monitoring result and a measured value wherein the output unit 207 can be selected from a group consisting of a LED light signal, a LCD display and an audio buzzer. The LCD display can display the real measured value, for example, 6.5MΩ of the operator ground resistance or 2.3V of the operator ground voltage. The LED light signal can display the light signal of the monitoring result; for example, the green light is turned on when the measured value is smaller than the limit-value, the red light is turned on when the measured value is greater than the upper limit-value, and the yellow light is turned on when the measured value is smaller than the lower limit-value. The audio buzzer can be used for alarming when the alarm is generated. The output unit 207 can send a signal to the external equipment, which is being monitored, to let the external equipment take some suitable emergency reactions.

The communication connection unit 208 provides an interface between the application-specific processor 206 and a PC or an external controlling unit. Furthermore, the communication connection unit 208 connects bilaterally with the application-specific processor 206 for the communication of the controlling commands to fully support the configurable adjustment of enabling or disabling of the monitored objects, the adjustment of the limit-values, the data transferring among several monitoring devices and the communication of the other management functions.

According to the monitor method and block diagrams described above, the main purpose of the presented invention is to offer a highly flexible, efficient and accurate monitor method of the workbench to achieve the maximum performance of the static protection in a workbench. The outstanding features include: 1. Forcing the operators to stay grounded continuously. 2. Digital display of measured resistance and voltage value. 3. The monitoring items can be enabled or disabled at any time. 4. The limit value of the monitoring items can be changed at any time in order to conform to the international standard, such as ANSI/ESD S20.20-2007, or to meet the requirement of some special work environments. 5. Effectively filter the noises of the human body to obtain the accurate measured results. 6. Able to transport the measured values from the monitor to an external controller (for example, a PC or a server) in order to enable the construction of a monitor network.

This invention is suitable for many applications such as: SMT electronic production area, military and national defense static control area, semiconductor clean room, high-tech laboratories, aviation and aerospace calibration area, hospital ESD-control area, medical static restrict area, biochemistry static control area and explosives handling area.

Although the present invention has been described in terms of specific exemplary embodiments and examples, it will be appreciated that the embodiments disclosed herein are for illustrative purposes only and various modifications and alterations might be made by those skilled in the art without departing from the spirit and scope of the invention as set forth in the following claims.

What is claimed is:

1. A method for configurable ground monitoring of a workbench a plurality of object, said method comprising the steps of:
    detecting if each of monitored objects connected to a monitoring device;
    calculating one or more digital values of each of the monitored objects, and accumulating the digital values of the monitored objects;
    detecting if each of the monitored objects reaches a predetermined number of samples;
    calculating an average value of each of the monitored objects according to detecting result;
    comparing an average measured value with a predetermined digital limit-value of each of the monitored objects, and sounding a corresponding alarm if the average measured value exceeds the predetermined digital limit-value;
    outputting the digital value and a compared result;
    detecting if an operator's ground connection is activated; and
    renewing a timer counter according to detecting result, and sounding an alarm when the monitoring of operator ground connection is off and exceeds a predetermined time period.

2. The method according to claim 1, wherein the monitored objects include operator ground resistance, operator ground voltage, mat ground resistance, and equipment ground resistance.

3. The method according to claim 1, wherein the operator ground connection is off represents that an operator fails to insert a dual wrist strap into the monitor device correctly.

4. The method according to claim 1, wherein the detecting of each of the monitored objects in a monitor device can be set by a user at any time through an external controlling interface or built-in hardware switches.

5. The method according to claim 1, wherein the predetermined digital limit-value can be set by a user at any time through an external controlling interface or built-in hardware switches.

6. The method according to claim 1, wherein the measured value of each of the monitored objects is a digital value calculated through a digital calculation method.

7. A device for configurable ground monitoring of a workbench, comprising:
    an operator ground connection detecting unit detecting if an operator performs a ground connection via a dual wrist strap and providing a circuit for calculating an operator ground resistance and an operator ground voltage;
    an operator ground resistance and ground voltage detecting unit generating a voltage signal of the operator ground resistance and the operator ground voltage, and determining if the operator is in a standby state without the ground connection;
    a mat ground resistance detecting unit providing a closed loop circuit for measuring a voltage signal corresponding to a mat ground resistance;
    an equipment ground resistance detecting unit providing a closed loop circuit for measuring a voltage signal corresponding to an equipment ground resistance;
    an application-specific processor reading the measured voltage signals provided from the operator ground resistance and ground voltage detecting unit, the mat ground resistance detecting unit, and the equipment ground resistance detecting unit to determine an overall monitoring status;

wherein the application-specific processor summarizing, averaging and transferring measured analog signals into a digital data, and the application-specific processor then comparing the digital data with the digital limit-value for determining if an alarm sounds;

wherein a timer counter is used when the operator is in the standby state without the ground connection, the alarm is sounded when the operator did not insert the dual wrist strap into the operator ground connection detecting unit for more than a predetermined time period;

a ground unit being an essential element for constructing the closed loop circuits of the operator ground resistance circuit, the mat ground resistance circuit, and the equipment ground resistance circuit separately; and a communication connection unit connecting the application-specific processor and providing an interface between the application-specific processor and a PC or an external controlling unit.

8. The device according to claim 7, further comprising:

an output unit receiving data sent from the application-specific processor and displaying the monitoring result and the measured value.

9. The device according to claim 8, wherein the output unit can be selected from a group consisting of a LED light signal, a LCD display, and an audio buzzer.

10. The device according to claim 7, wherein the application-specific processor further comprises a calculation method for filtering 50 Hz/60 Hz noise commonly seen on a human body by selecting a suitable digital sampling time.

* * * * *